United States Patent
Hung et al.

(10) Patent No.: US 10,586,707 B2
(45) Date of Patent: Mar. 10, 2020

(54) SELECTIVE DEPOSITION OF METAL SILICIDES

(71) Applicants: Applied Materials, Inc., Santa Clara, CA (US); The Regents of the University of California, Oakland, CA (US)

(72) Inventors: Raymond Hung, Palo Alto, CA (US); Namsung Kim, Sunnyvale, CA (US); Srinivas D. Nemani, Sunnyvale, CA (US); Ellie Y. Yieh, Sunnyvale, CA (US); Jong Choi, San Diego, CA (US); Christopher Ahles, San Diego, CA (US); Andrew Kummel, San Diego, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/189,429

(22) Filed: Nov. 13, 2018

(65) Prior Publication Data

US 2019/0103278 A1 Apr. 4, 2019

Related U.S. Application Data

(63) Continuation-in-part of application No. 15/988,820, filed on May 24, 2018, now Pat. No. 10,475,655.
(Continued)

(51) Int. Cl.
*H01L 21/285* (2006.01)
*H01L 21/311* (2006.01)
(Continued)

(52) U.S. Cl.
CPC .... *H01L 21/28518* (2013.01); *C23C 16/0245* (2013.01); *C23C 16/04* (2013.01);
(Continued)

(58) Field of Classification Search
None
See application file for complete search history.

(56) References Cited

U.S. PATENT DOCUMENTS 7,780,793 B2 8/2010 Yang et al.
9,034,773 B2 5/2015 Thedjoisworo et al.
(Continued)

OTHER PUBLICATIONS

B. Kalanyan et al., Chem. Mater., 28, 117-126 (2016).
(Continued)

*Primary Examiner* — Jay C Chang
(74) *Attorney, Agent, or Firm* — Patterson + Sheridan, LLP

(57) ABSTRACT

Embodiments of the disclosure relate to selective metal silicide deposition methods. In one embodiment, a substrate having a silicon containing surface is heated and the silicon containing surface is hydrogen terminated. The substrate is exposed to sequential cycles of a $MoF_6$ precursor and a $Si_2H_6$ precursor which is followed by an additional $Si_2H_6$ overdose exposure to selectively deposit a $MoSi_x$ material comprising $MoSi_2$ on the silicon containing surface of the substrate. Methods described herein also provide for selective native oxide removal which enables removal of native oxide material without etching bulk oxide materials.

15 Claims, 11 Drawing Sheets

Related U.S. Application Data

(60) Provisional application No. 62/511,521, filed on May 26, 2017.

(51) Int. Cl.

| | | |
|---|---|---|
| *H01L 21/324* | (2006.01) | |
| *C23C 16/46* | (2006.01) | |
| *C23C 16/42* | (2006.01) | |
| *C23C 16/455* | (2006.01) | |
| *C23C 16/04* | (2006.01) | |
| *C23C 16/08* | (2006.01) | |
| *C23C 16/02* | (2006.01) | |

(52) U.S. Cl.
CPC .............. *C23C 16/08* (2013.01); *C23C 16/42* (2013.01); *C23C 16/45527* (2013.01); *C23C 16/45542* (2013.01); *C23C 16/45553* (2013.01); *C23C 16/46* (2013.01); *H01L 21/28562* (2013.01); *H01L 21/31116* (2013.01); *H01L 21/324* (2013.01)

(56) References Cited

U.S. PATENT DOCUMENTS

| | | | |
|---|---|---|---|
| 2011/0124192 A1* | 5/2011 | Ganguli | .................. C23C 16/18 438/653 |
| 2014/0295665 A1 | 10/2014 | Zheng et al. | |
| 2018/0080121 A1 | 3/2018 | Longrie et al. | |
| 2018/0247821 A1 | 8/2018 | Chen et al. | |

OTHER PUBLICATIONS

D. Seghete et al., Chem. Mater., 23, 1668-1678 (2011).
J. Kwon et al., Chem. Mater., 24, 1025-1030 (2012).
K. Bernal-Ramos et al., Chem. Mater., 27, 4943-4949 (2015).
M. A. Chesters, J. Phys. Condens. Matter, 3, S251 (1991).
P. C. Lemaire, J. Chem. Phys. 146, 052811 (2017).
International Search Report and Written Opinion for International Application No. PCT/US2019/052967 (44015716WO01) dated Jan. 10, 2020.

* cited by examiner

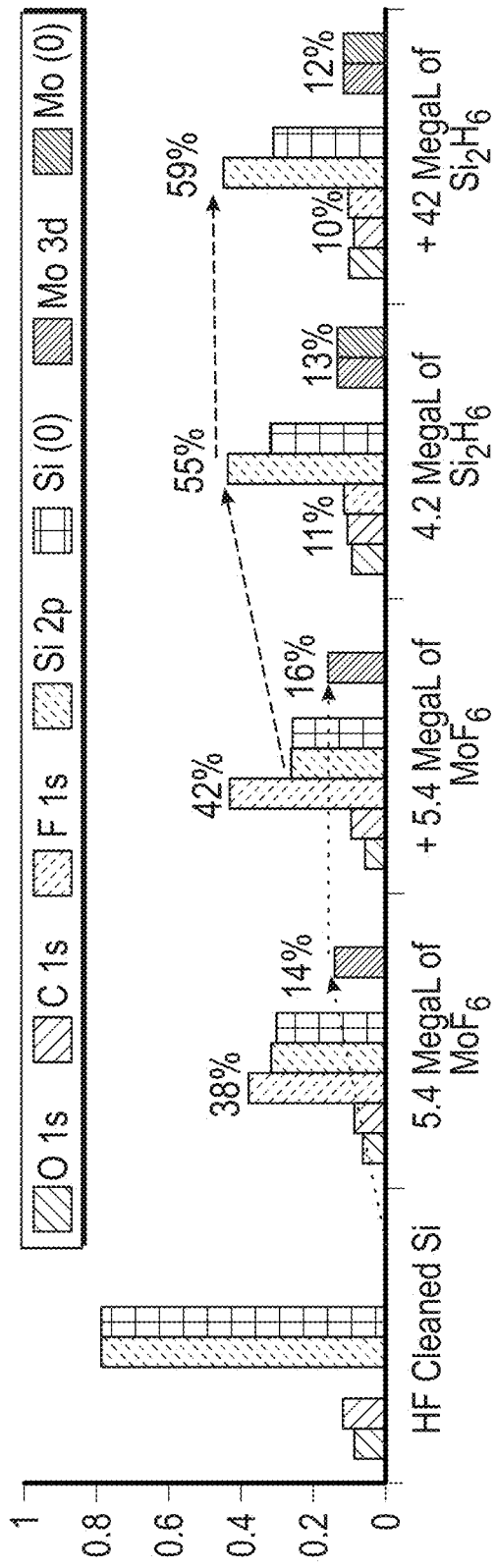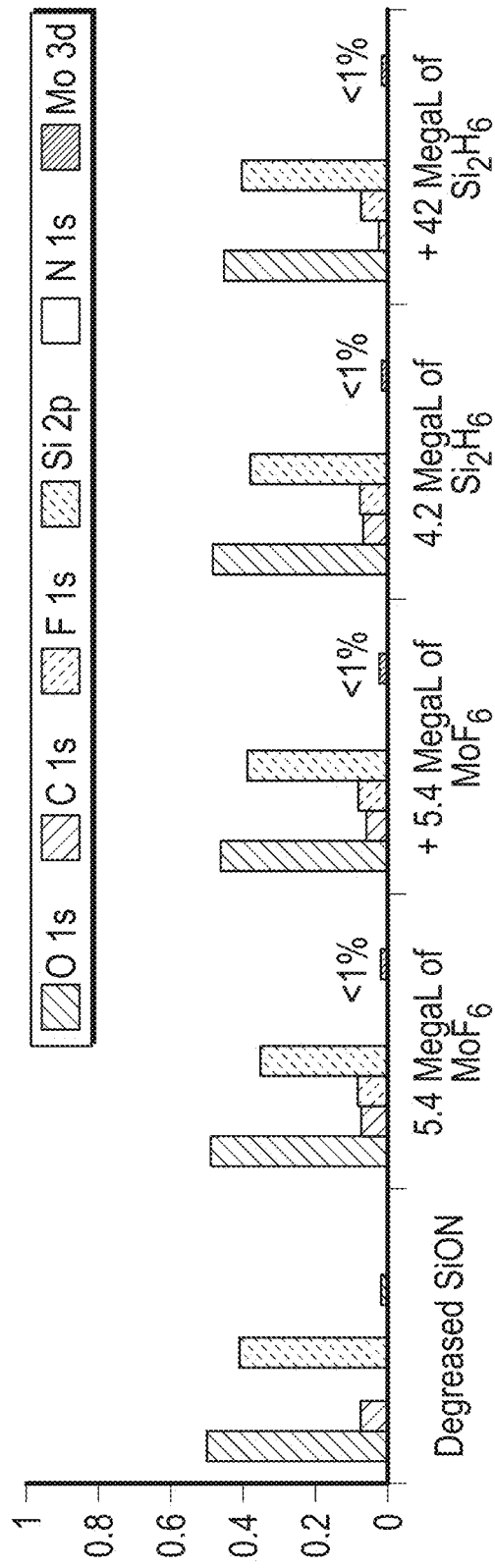

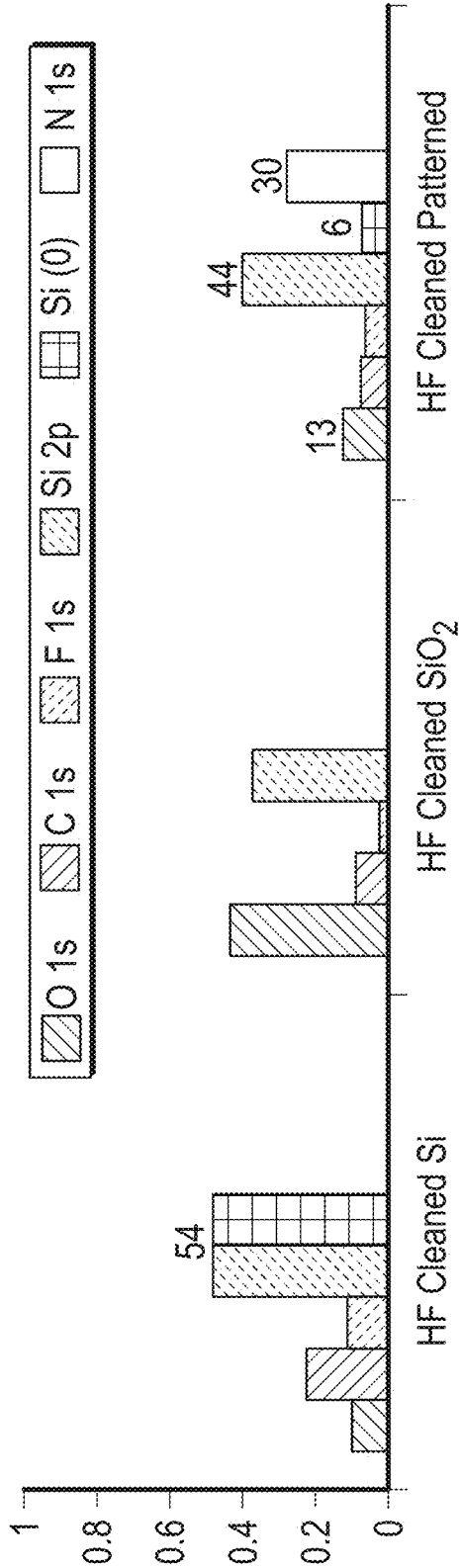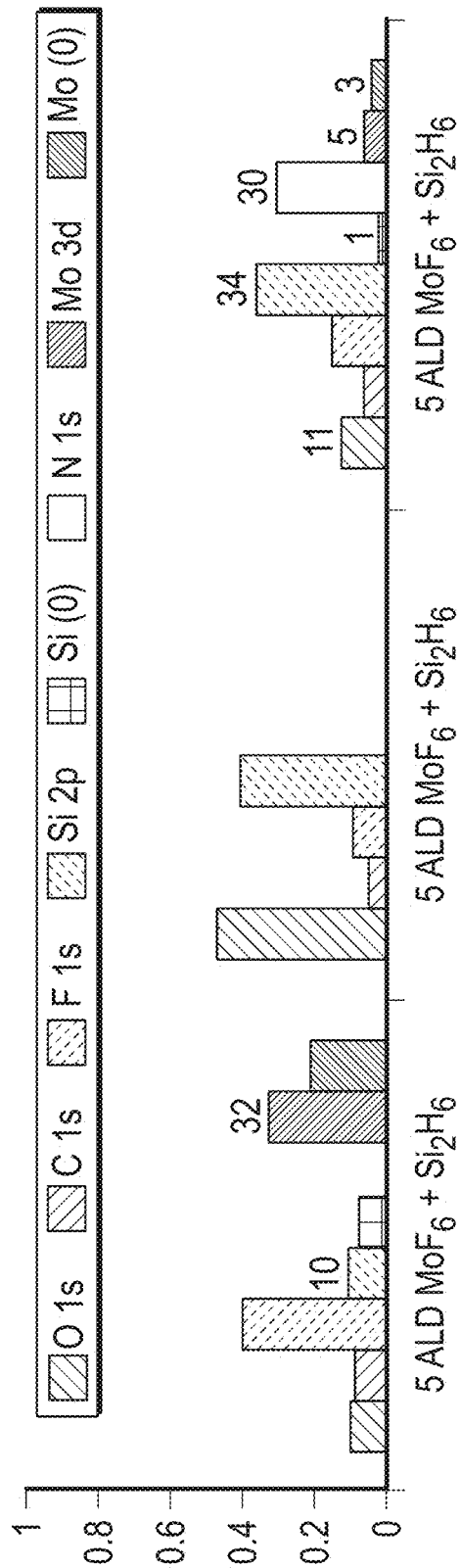
FIG. 3A
FIG. 3B

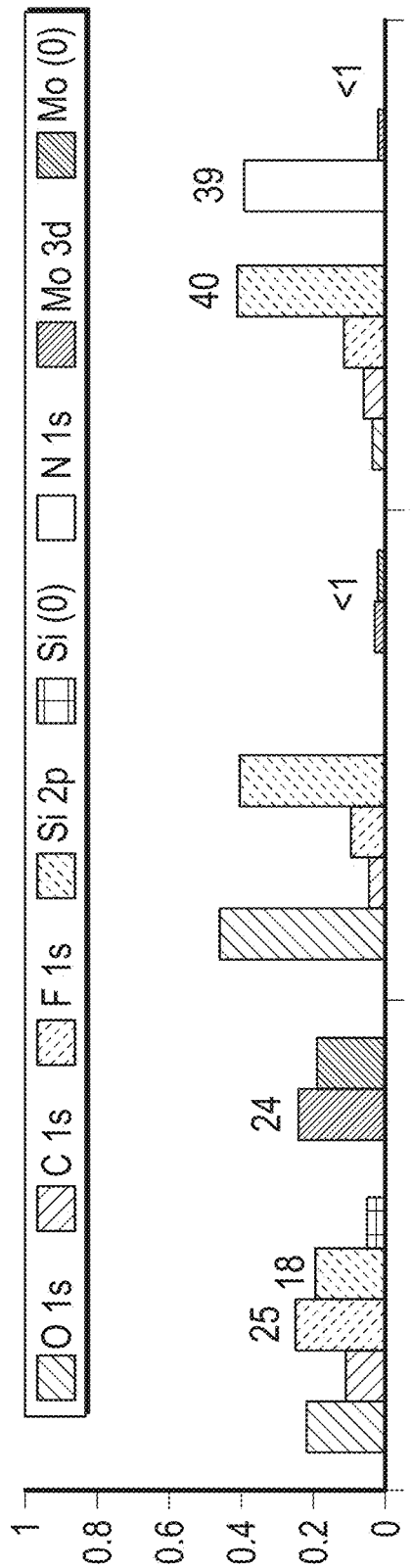
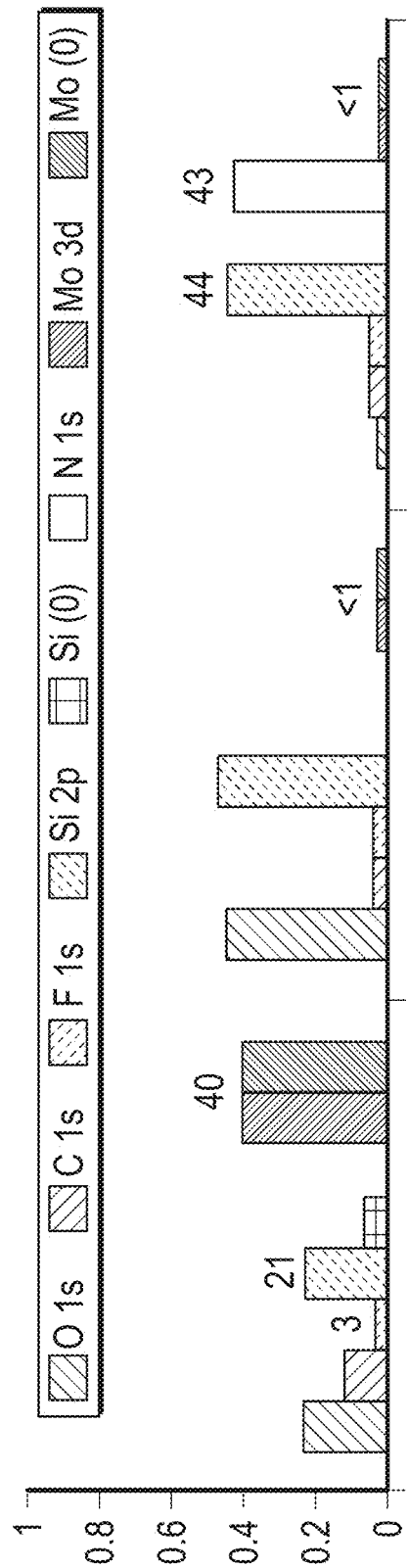
FIG. 4B
FIG. 4C

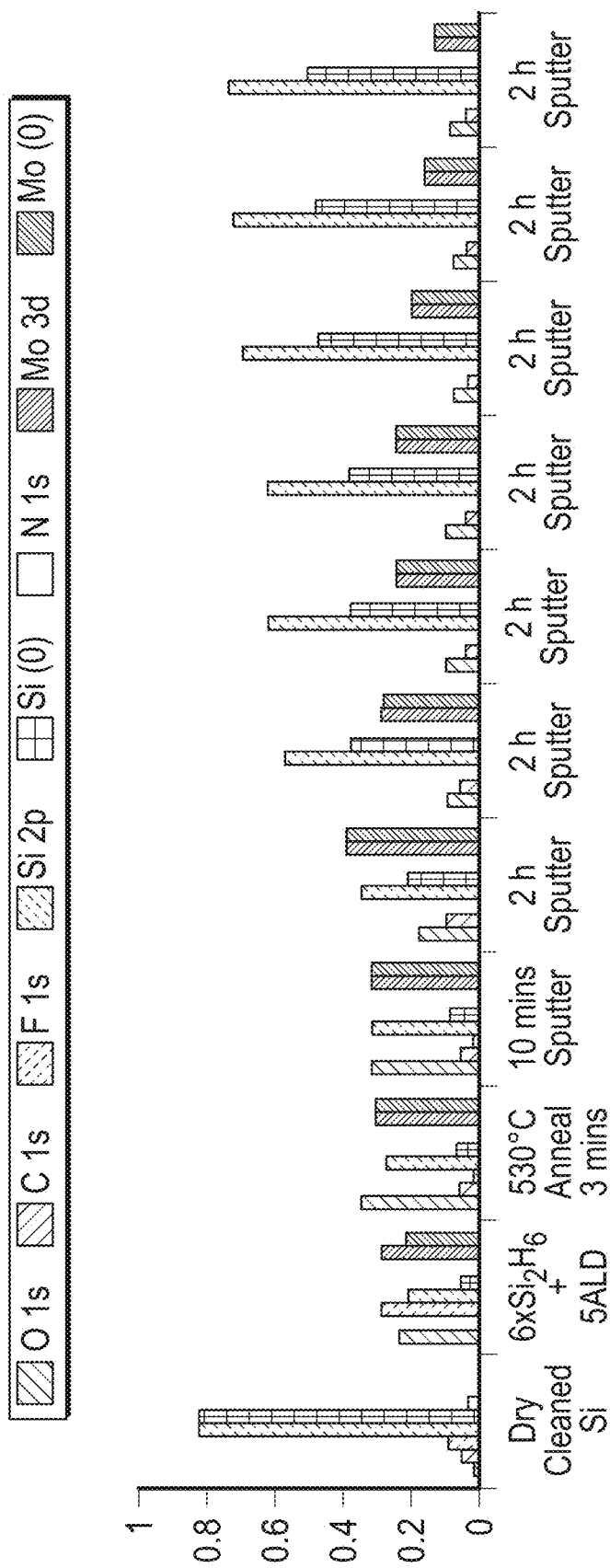

SELECTIVE DEPOSITION OF METAL SILICIDES

CROSS-REFERENCE TO RELATED APPLICATIONS

This application is a continuation-in-part of U.S. patent application Ser. No. 15/988,820, filed May 24, 2018, which claims benefit of U.S. Provisional Patent Application No. 62/511,521, filed May 26, 2017, both of which are hereby incorporated by reference in their entirety.

BACKGROUND

Field

Embodiments of the present disclosure generally relate to methods for metal silicide deposition and selective native silicon oxide etching.

Description of the Related Art

Accurate positioning of materials on nanoscale devices is critical for manipulation of atomic-scale properties for next-generation nanoelectronics. For semiconductor fabrication, detailed positioning of materials with excellent conformality and stoichiometry is utilized to meet demand for cost, yield, and throughput. As the channel lengths of metal-oxide-semiconductor field effect transistors (MOSFETs) continue to be scaled down, it is desirable to overcome the constraints originating from top-down processes, such as damage from reactive ion etching and structural complexity in structure alignment on three-dimension (3D) surfaces.

Recently, as MOSFET devices have been fabricated in 3D structures (FinFETs), there has been increasing interest in nanoscale area-selective deposition while maintaining conformal film quality. One approach to area-selective deposition is the utilization of self-assembled monolayers (SAMs) as passivation layers in combination with atomic layer deposition (ALD) processes. The passivation layers block or eliminate surface functional groups that are reactive towards ALD precursors so that selectivity can be obtained; however, the SAMs approach still utilizes selective deposition of the passivation layer. Furthermore, the passivation layers are selectively removed after the selective deposition which necessitates additional process complexity and reduced throughput.

Moreover, to enable advanced selective area deposition, native oxide materials are to be removed in order to expose underlying materials for selective deposition thereupon. However, at advanced nodes, native oxide removal becomes increasingly complex and selectivity is difficult when other oxide materials in addition to native oxide materials exist on substrate.

Thus, what is needed in the art are improved methods for selective material deposition and selective oxide removal.

SUMMARY

In one embodiment, a substrate processing method is provided. The method includes heating a substrate having a silicon containing surface to a first temperature, exposing the substrate to a plasma comprising hydrogen, exposing the substrate to a first dosage of a $MoF_6$ precursor, and exposing the substrate to a second dosage of a $Si_2H_6$ precursor. The exposing the substrate to a first dosage and the exposing the substrate to a second dosage is sequentially cycled and after the sequential cycling, the substrate is exposed to a third dosage of the $Si_2H_6$ precursor.

In another embodiment, a substrate processing method is provided. The method includes positioning a substrate on a heater in a reaction chamber having chamber walls, heating the substrate on the heater to a first temperature, maintaining the chamber walls at a second temperature less than the first temperature, and exposing a silicon containing surface of the substrate to hydrogen. The substrate is exposed to a first dosage of a $MoF_6$ precursor, the substrate is exposed to a second dosage of a $Si_2H_6$ precursor, the exposing the substrate to a first dosage and the exposing the substrate to a second dosage is sequentially cycled, and after the sequential cycling, the substrate is exposed to a third dosage of the $Si_2H_6$ precursor.

In yet another embodiment, a substrate processing method is provided. The method includes heating a substrate to a first temperature, exposing a silicon containing surface of the substrate to a hydrogen containing plasma, exposing the substrate to a first dosage of a $MoF_6$ precursor, and exposing the substrate to a second dosage of a $Si_2H_6$ precursor. The exposing the substrate to a first dosage and the exposing the substrate to a second dosage is sequentially cycled, after the sequential cycling, the substrate is exposed to a third dosage of the $Si_2H_6$ precursor, and the substrate is annealed after the exposing the substrate to a third dosage at a second temperature of between about 500° C. and about 550° C.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIG. 1A illustrates X-ray photoelectron spectroscopy (XPS) data of $MoSi_x$ film selectivity on a silicon substrate according to an embodiment described herein.

FIG. 1B illustrate XPS data of $MoSi_x$ film selectivity on a silicon oxynitride substrate according to an embodiment described herein.

FIG. 3A illustrates XPS chemical composition data of various elements present on different substrate types prior to ALD processing according to an embodiment described herein.

FIG. 3B illustrates XPS chemical composition data of various elements present on different substrate types after 5 ALD cycles according to an embodiment described herein.

FIG. 4B illustrates XPS chemical composition data of various elements present on different substrate types after 5 ALD cycles according to an embodiment described herein.

FIG. 4C illustrates XPS chemical composition data of the substrates of FIG. 4B after an annealing process according to an embodiment described herein.

FIG. 6A illustrates XPS depth profiling data of a $MoSi_x$ film after Ar sputtering according to an embodiment described herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 2A:
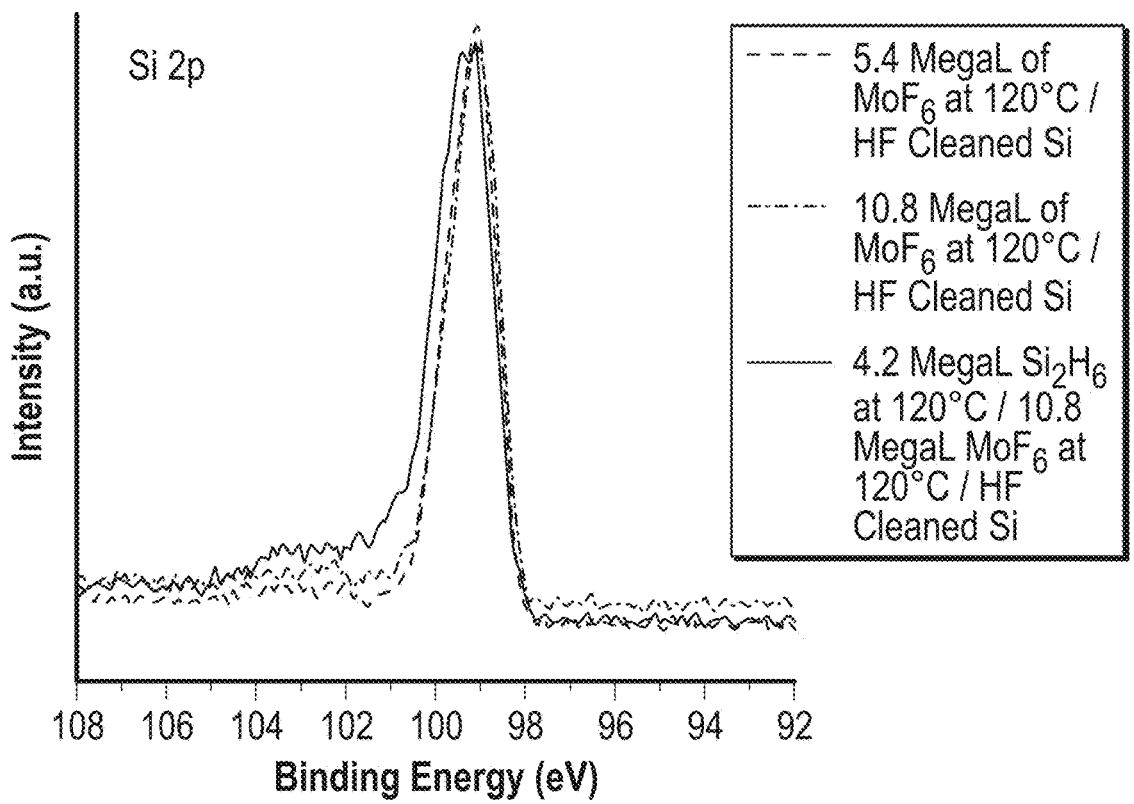
FIG. 2A illustrates XPS oxidation state data of Si and Mo on a silicon substrate according to an embodiment described herein.

Embodiments described herein include methods which utilize substrate-dependent reactivity of ALD precursors for area-selective deposition. More specifically, embodiments of the disclosure relate to selective deposition of $MoSi_x$ on Si preferentially to $SiO_2$, SiON and $SiN_x$ using substrate selectivity of $MoF_6$ and $Si_2H_6$. To achieve a stoichiometric $MoSi_2$ film, additional Si incorporation into the film after the $MoF_6$ and $Si_2H_6$ ALD cycles was performed by dosing $Si_2H_6$ onto a Mo rich $MoSi_x$ film. Methods described herein also provide for selective native oxide removal which enables removal of native oxide material without etching bulk oxide materials.

Highly selective deposition of $MoSi_x$ on Si preferentially to $SiO_2$ and $SiN_x$ was achieved via atomic layer deposition (ALD) using $MoF_6$ and $Si_2H_6$ precursors at a temperature of about 120° C. Deposition selectivity was enabled by the lack of chemical reactivity between the reactants ($MoF_6$ and $Si_2H_6$) and $SiO_2$ and $SiN_x$ containing substrates. In contrast, $MoF_6$ nucleated in a self-limiting manner on H-terminated Si, and a subsequent $Si_2H_6$ exposure reduced $MoF_x$ to $Mo^0$ which is consistent with Mo—Si bond formation.

X-Ray photoelectron spectroscopy (XPS) revealed that 5 ALD cycles of $MoF_6$ and $Si_2H_6$ selectively deposited a sub-stoichiometric $MoSi_2$ film on the Si substrate. In the ALD process, the $MoF_6$ and $Si_2H_6$ precursors were sequentially cycled in a repeating manner with a purge between each successive precursor exposure. Additional $Si_2H_6$ doses on the sub-stoichiometric $MoSi_2$ film incorporated more Si into the film without disturbing the deposition selectivity over $SiO_2$ and $SiN_x$. In one embodiment, a bulk of the $MoSi_x$ film has a ratio of Si:Mo between about 1.7 and about 1.9 with less than about 10% F and O impurities. Embodiments described herein are believed to be advantageous over conventional high pressure Si ALD cycles for the formation of silicide materials, for example, in the formation of source/drain contact structures.

Deposition selectivity of $MoSi_x$ was analyzed, according to the embodiments described herein, on a patterned Si substrate containing three-dimensional (3D) nanoscale $SiO_2$ and $SiN_x$ features. Cross-sectional transmission electron microscopy (TEM) indicated that selective $MoSi_x$ deposition was achieved on nanoscale 3D structures. In one embodiment, less than about 10 nuclei/$\mu m^2$ were present on $SiO_2$; since $SiO_2$ has approximately $10^7/\mu m^2$ OH groups, this corresponds to a selectivity of about $10^7$:1 between the OH groups on $SiO_2$ and Si—H groups on Si. Thus, it is believed that substrate-dependent selectivity for silicide deposition enables the elimination of passivant (i.e. SAMs) utilization.

EXPERIMENTAL

Various substrate types were utilized for the $MoSi_x$ silicide formation processes described herein. Four types of substrates were utilized: P-type Si (100), thermally grown $SiO_2$ on Si (100), SiON and patterned substrates having Si, $SiO_2$, and $SiN_x$ material surfaces on a single substrate. The SiON (silicon oxynitride) in described herein is $Si_3N_4$, unless otherwise noted, which has been subjected to reactive ion etching and plasma ashing in oxygen during fabrication. Thus, the SiON substrate contains oxygen which is similar to the conditions of $Si_3N_4$ after processing in integrated 3D nanoscale devices.

The substrates were diced into 12 mm×3 mm pieces and degreased with acetone, methanol, and deionized (DI) $H_2O$. The native oxide on Si was removed by immersing the degreased substrates into a 0.5% HF(aq) solution for 30 seconds. For consistency in cleaning procedure, the $SiO_2$, SiON, and patterned substrates were subjected to the same cleaning procedure. In certain embodiments, the native oxide removal process is the SICONI® pre-clean process available from Applied Materials, Inc., Santa Clara, Calif.

It is also contemplated that a plasma based native oxide removal process may be utilized. For example, an $NF_3/H_2$ and/or NF3/NH3 plasma cleaning process may be utilized to clean and hydrogen terminate a silicon containing surface of the substrates. On SiON substrates, the $NF_3$ plasma treatment is believed to prevent or substantially reduce deposition selectivity loss by passivating active hydroxyl nucleation sites.

Figure 8:
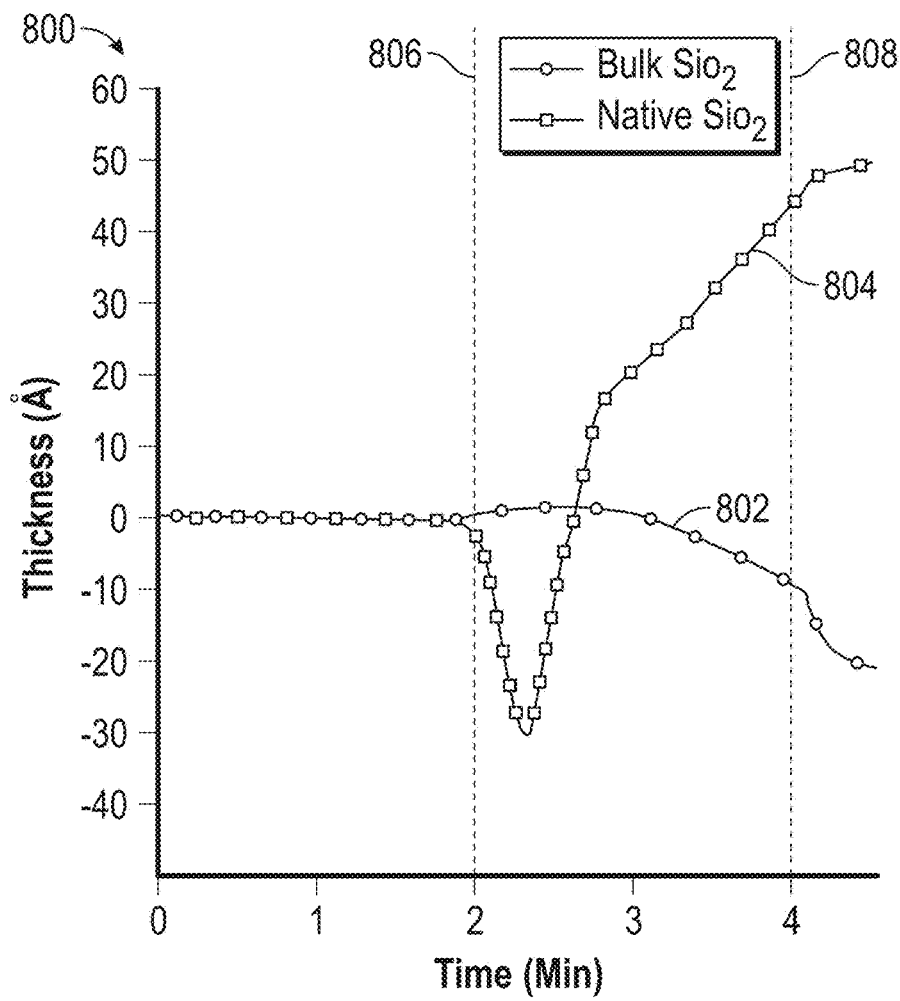
FIG. 8 is a graph illustrating selective etching of native silicon oxide to bulk silicon oxide according to an embodiment described herein.

FIG. 8 is a graph 800 illustrating selective etching rates of native silicon oxide and bulk silicon oxide thicknesses as a function of time during plasma processing. Data 802 is representative of bulk silicon oxide thickness when exposed to an $NF_3/NH_3$ plasma. Data 804 is representative of native silicon oxide thickness when exposed to the $NF_3/NH_3$ plasma. Time 806 is representative of when the $NF_3/NH_3$ plasma is turned on and time 808 is representative of when the NF$_3$/NH$_3$ plasma is turned off.

In one embodiment, the plasma for selective etching of the native silicon oxide selectively to the bulk silicon oxide is formed in-situ in a processing chamber. Alternatively, the plasma for selective etching of the native silicon oxide selectively to the bulk silicon oxide is formed remotely, for example, by a remote plasma source, before delivery to the processing chamber. Precursors utilized to form the plasma include NF$_3$ and NH$_3$. In one embodiment, an inert carrier gas, such as Ar, is utilized to facilitate delivery of active species to the substrate for selective removal of the native silicon oxide.

In one embodiment, a ratio of NF$_3$:NH$_3$ is between about 1:5 and about 1:20, such as about 1:10. In embodiments utilizing an Ar carrier gas, the Ar is provided in an amount greater than the NF$_3$ but less than the NH$_3$. For example, a ratio of NF$_3$:NH$_3$:Ar is 1:10:1.5. A pressure of the process chamber environment within which the selective native oxide removal process is performed is between about 10 mTorr and about 1,000 mTorr, such as between about 100 mTorr and about 500 mTorr, for example, about 200 mTorr. In one embodiment, the pressure is about 190 mTorr. A power utilized to generate the plasma is between about 10 W and about 500 W, for example, between about 50 W and about 250 W, such as about 100 W. A temperature of the environment within which the native oxide removal process is performed is between about 30° C. and about 70° C., such as between about 40° C. and about 50° C., for example, about 45° C.

At time 806, the plasma is initiated and the native silicon oxide 804 experiences a thickness reduction illustrated by a reduction in thickness of the native silicon oxide material. In one embodiment, the plasma process is performed for an amount of time less than one minute, for example, less than 40 seconds, such as between about 15 seconds and about 30 seconds. During the first minute or less of plasma exposure, the native silicon oxide 804 is etched while the bulk silicon oxide experiences substantially no thickness reduction, indicating a high degree of selectivity for removal of the native silicon oxide preferentially to the bulk silicon oxide. It is also contemplated that the native oxide removal process is also selective to silicon nitride materials such that native silicon oxide is removed preferentially to silicon nitride.

Atomic force microscopy analysis of the substrate after selective removal of the native silicon oxide revealed that exposed silicon surfaces (where the native silicon oxide was removed from) exhibited sub-angstrom surface roughness. Such a roughness is consistent with no or substantially no etching of the underlying silicon material after native oxide removal, as etching of the silicon material would be expected to roughen the surface.

In certain embodiments, residual material, such an (NH$_4$)$_2$)SiF$_6$ salt may remain on the substrate after performing the selective native oxide removal process. To remove the salt, an optional annealing process is performed. In one embodiment, the annealing process is between about 80° C. and about 160° C., such as between about 100° C. and about 140° C., for example, about 120° C. The annealing is believed to remove the salt, for example by volatilizing the salt, from the surface, such as a silicon surface, of the substrate.

Figure 9:
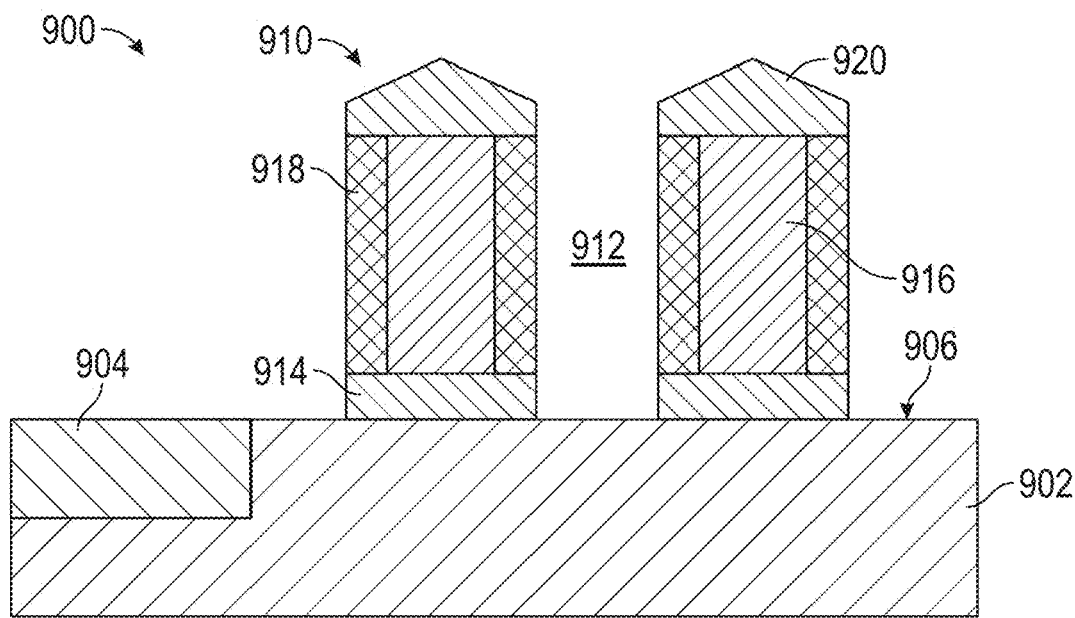
FIG. 9 is a cross-sectional schematic illustration of a portion of a contact structure according to an embodiment described herein.

FIG. 9 is a cross-sectional schematic illustration of a substrate 900 having a contact structure 910 formed thereon according to an embodiment described herein. The substrate 900 includes a silicon material film 902 and a bulk silicon oxide material 904 formed on the silicon material film 902. Contact structures 910 are formed on a surface 906 of the silicon material film 902. The surface 906, prior to selective native oxide removal, has a thin film of native oxide formed thereon. Utilizing the embodiments described above, the native oxide is removed from the surface 906 without substantially altering or removing the bulk silicon oxide 904 or the underlying silicon film material 902.

Contact structures 910 formed on the surface 906 include a gate 916 which is bounded by a gate oxide 914, spacers 918, and a cap 920. In one embodiment, the gate 916 is a metal containing material. The spacers 918 and the cap 920 include a nitride containing material, such as a silicon nitride material. Utilizing the selective native oxide removal processes described herein, either before or after formation of the contact structure 910, enables preparation of the surface 906 for subsequent metal deposition. Metal deposition in a channel 912 formed between adjacent contact structures 910 extends from the surface 906 toward the cap 920. By selectively removing the native oxide from the surface 906, metal adhesion to the underlying silicon material film 902 is improved.

After native oxide removal, the substrates were blow-dried using high purity N$_2$ gas. The Si, SiO$_2$, SiON, and patterned substrate were loaded together on a single substrate holder to expose the substrates to the same ALD conditions. The substrates were loaded into a load lock chamber pumped by a turbo molecular pump and backed by a mechanical pump. The base pressure of the load lock was about $2.0 \times 10^{-7}$ Torr. Subsequently, the substrates were transferred in-situ to an ultra-high vacuum chamber with a base pressure of about $3.0 \times 10^{-10}$ Torr pumped by an ion pump and titanium sublimation pump. The ultra-high vacuum chamber was equipped with a monochromatic XPS apparatus, a scanning tunneling microscope (STM), and annealing system using a pyrolytic boron nitride (PBN) heater.

The substrates were first annealed at 120° C. in the ultra-high vacuum chamber and the chemical composition of the substrates were determined using XPS. The substrates were transferred in-situ to a reaction chamber having a base pressure of about $5.0 \times 10^{-7}$ Torr. For MoSi$_x$ deposition, MoF$_6$ (99% purity) and Si$_2$H$_6$ (99.99% purity) precursors were employed.

During the ALD cycles, a constant purge of N$_2$ (80 mTorr) was used, and the pressure of this purge was controlled using a leak valve. The MoF$_6$ and Si$_2$H$_6$ doses were regulated using pneumatic valves. An expansion volume was employed for the MoF$_6$ and Si$_2$H$_6$ doses. Utilization of the expansion volume includes filling a secondary volume with MoF$_6$ or Si$_2$H$_6$ and dosing the precursors from their respective secondary volumes. The fill time for the MoF$_6$ was between about 10 ms and about 10 ms, such as about 40 ms. The dose time for the MoF$_6$ was between about 10 ms and about 100 ms, such as about 50 ms. The fill time for the Si$_2$H$_6$ was between about 1 ms and about 50 ms, such as about 18 ms. The dose time for the Si$_2$H$_6$ was between about 1 ms and about 50 ms, such as about 18 ms.

The exposures of MoF$_6$ and Si$_2$H$_6$ were calculated in terms of Langmuirs (L) where $1 L=1 \times 10^{-6}$ Torr$\times$1 sec. The pressure spikes during the exposures were monitored using a convectron gauge in the reaction chamber. The doses were about 1.8 MegaL for MoF$_6$ and about 4.2 MegaL for Si$_2$H$_6$ with a 2-minute wait time between the doses. The substrates were heated using the PBN heater, and the temperature was maintained at a temperature of between about 100° C. and about 150° C., such as about 120° C. The chamber walls were maintained at a temperature of between about 65° C.

and about 85° C. In one embodiment, the MoF$_6$ doses were between about 1.0 MegaL and about 10 MegaL. In another embodiment, the Si$_2$H$_6$ doses were between about 1.0 MegaL and about 10 MegaL.

After the deposition cycles, the substrates were transferred in-situ to the ultra-high vacuum chamber for XPS and STM analysis. For the XPS measurement, the X-rays were generated by an Al Kα anode (1486.7 eV). XPS data was acquired using constant analyzer-energy (CAE) with a step width of 0.1 eV and a pass energy of 50 eV. The XPS detector was positioned at 60° to the substrate normal (30° take-off angle from the substrate surface) with a detector-acceptance angle of 7°. XPS spectra were analyzed after correcting each peak area with its respective relative sensitivity factor using a Casa XPS v.2.3 program. All of the chemical components in this work were normalized to the sum of all components. Scanning tunnel microscopy was performed with a substrate bias of −1.8 V and a constant current of 200 pA.

To investigate the elemental composition of the bulk of the film, Ar$^+$ sputtering was performed in conjunction with XPS. A lens voltage of 5 kV with a beam current of 1.2 μA at 6.0×10$^{-7}$ Torr of Ar was employed; since a raster was used to cover the full substrate area, the current density was approximately 1.2 uA/50 mm$^2$. The MoSi$_x$ substrate was maintained at 25° C. during sputtering to minimize any thermal desorption.

Results

FIG. 1A illustrates data of the XPS chemical composition of the HF cleaned Si surface before and after sequential doses of MoF$_6$ and Si$_2$H$_6$ at 120° C. Two sets of 5.4 MegaL MoF$_6$ were dosed on a HF cleaned Si substrate at 120° C. XPS showed saturation of Mo at 16%. Afterward, 4.2 Si$_2$H$_6$ MegaL and an additional 42 MegaL of Si$_2$H$_6$ were dosed onto the MoF$_6$-saturated Si surface at 120° C. resulting in Si being saturated at 59%. In one embodiment, the MoF$_6$ was dosed between about 1 MegaL and about 10 MegaL. In another embodiment, the SI$_2$H$_6$ was dosed between about 1 MegaL and about 10 MegaL. In another embodiment, the additional Si$_2$H$_6$ dose was between about 20 MegaL and about 50 MegaL.

After the HF clean, all the Si was in an oxidation state of 0 with 9% O and 12% C contamination. The contamination is believed to be caused by adventitious hydrocarbon adsorption during the substrate transfer into vacuum. HF(aq) was utilized to eliminate native oxide on Si and leave the Si surface H-terminated. It should be noted that the Si 2p data in FIG. 1 indicates the total amount of Si while the Si (0) data indicates the amount of Si which is in an oxidation state of 0.

After the 5.4 MegaL of MoF$_6$ at 120° C., 14% Mo and 38% F were deposited on the HF cleaned Si surface. After an additional 5.4 MegaL of MoF$_6$ at 120° C. were dosed, the Mo concentration increased from 14% to 16% and the F concentration increased from 38% to 42%. This small increase in Mo and F content after an additional 5.4 MegaL of MoF$_6$ shows that the reaction of MoF$_6$ on HF cleaned Si is self-limiting. After the Si surface was saturated with MoF$_x$, the ratio of F/Mo was 2.6 and all of the Si was in an oxidation state of 0. Sequential doses of 4.2 MegaL of Si$_2$H$_6$ and 42 MegaL of Si$_2$H$_6$ indicate that the Si$_2$H$_6$ reaction also saturates on the MoF$_x$ covered Si surface. It is believed that with a thicker sub-stoichiometric MoSi$_2$ film, additional Si can be incorporated onto the surface. However, the Si$_2$H$_6$ reacts in a self-limiting manner on a thinner (monolayer) film of Mo.

After saturation of Si$_2$H$_6$, the Si content was 59% and F decreased to 10%. Since the substrate is Si, this increase of the Si content after dosing Si$_2$H$_6$ could be partially ascribed to the substrate since F desorption occurred. However, attenuation of the Mo after Si$_2$H$_6$ dosing was observed which is consistent with the deposition of Si. The reaction of MoF$_6$ and Si$_2$H$_6$ on H-terminated Si demonstrates the potential for MoSi$_x$ ALD on Si—H terminated Si.

FIG. 1B illustrates XPS chemical composition data for the same series of MoF$_6$ and Si$_2$H$_6$ saturation doses described above with regard to FIG. 1A but on a SiON substrate. As illustrated, no reaction was observed. It should be noted that while the SiON substrate was nominally SiON, XPS showed only negligible amounts of N on the surface and so this substrate is mostly ion damaged SiO$_x$. After the first 3 pulses of MoF$_6$, 8% F and negligible Mo (<1%) were observed. For the rest of the saturation doses, the SiON surface remained unreactive to both MoF$_6$ and Si$_2$H$_6$. While the SiON used in this study is ion damaged, the Si is in oxidation states of +3 and +4 and the data is consistent with the strong Si—O, Si—N, SiO—H bonds, thus substantially precluding the Si from forming bonds to Mo.

Figure 2B:
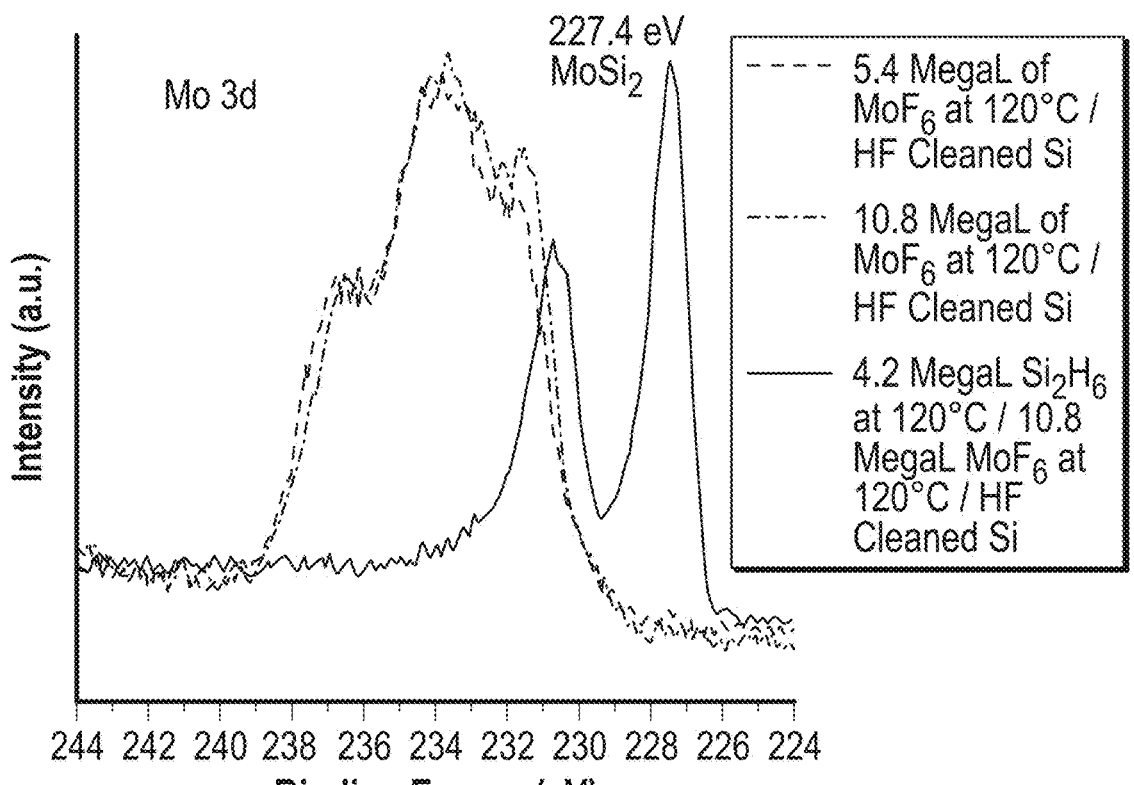
FIG. 2B illustrates XPS oxidation state data of Si and Mo on a silicon substrate according to an embodiment described herein.

FIGS. 2A and 2B illustrates XPS spectra of Si 2p and Mo 3d for the HF cleaned Si substrate are shown to compare the oxidation states at each experimental operation. FIG. 2A illustrates Si 2p peaks after sequential MoF$_6$ and S$_2$H$_6$ doses show that Si remained in an oxidation state of 0 after the 10.8 MegaL of MoF$_6$ at 120° C. (blue line) which is consistent with Mo—Si bond formation and no etching of Si by F. After the 4.2 MegaL Si$_2$H$_6$ dose at 120° C. (red line), most of the Si stayed in an oxidation state of 0. This is consistent with the formation of a monolayer of MoSi$_2$. A small oxidized Si peak emerged at higher binding energies which might be SiH$_x$F$_{4-x}$ (x=2 or 3) or SiO$_x$ at the surface. FIG. 2B illustrates Mo 3d peaks after sequential MoF$_6$ and S$_2$H$_6$ doses shows that the Mo 3d peaks existed in multiple oxidation states after the saturation dose of MoF$_6$ (black and blue line). After a Si$_2$H$_6$ dose (red line), all of the Mo was reduced and the peak was centered at 227.4 eV which is consistent with MoSi$_2$ formation.

After the first 5.4 MegaL of MoF$_6$, the Si 2p peak remained at an oxidation state of 0 which is consistent with Si—Mo bond formation. The Mo 3d peaks appeared at multiple oxidation states which indicates that the surface species are MoF$_x$ with x=4, 5 and 6 (black line). The additional 5.4 MegaL of MoF$_6$ did not change the oxidation states of the Si 2p or the Mo 3d peaks (blue line). The data suggests formation of Si—Mo—F$_x$ at the surface. It is noted that the F/Mo ratio was 2.6 after the MoF$_6$ saturation dose (FIG. 1A XPS data) while the Mo is in oxidation states of 4-6; therefore, it is believed that there is some Mo—O bond formation. A small shoulder peak at a higher binding energy (103 eV) on the Si 2p XPS peak appeared after a 4.2 MegaL of Si$_2$H$_6$ dose (red line). This is consistent with Si—F or Si—O formation. The Mo 3d spectra show that after a single Si$_2$H$_6$ dose, all of the Mo is reduced to Mo$^0$ with a binding energy of 227.4 eV. This is consistent with the formation of a monolayer of MoSi$_x$ and the transfer of any residual oxygen or fluorine from Mo to Si in the form of Si—O and Si—F bonds. A simplified reaction of MoF$_6$ and Si$_2$H$_6$ can be described as:

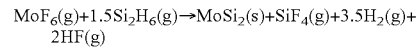

MoF$_6$(g)+1.5Si$_2$H$_6$(g)→MoSi$_2$(s)+SiF$_4$(g)+3.5H$_2$(g)+2HF(g)

ALD characteristics of MoSi$_x$ on the Si substrate and the selectivity over the SiO$_2$ and SiN$_x$ substrates were verified via XPS of MoSi$_x$ deposition on a patterned substrate. FIG.

Figure 3C:
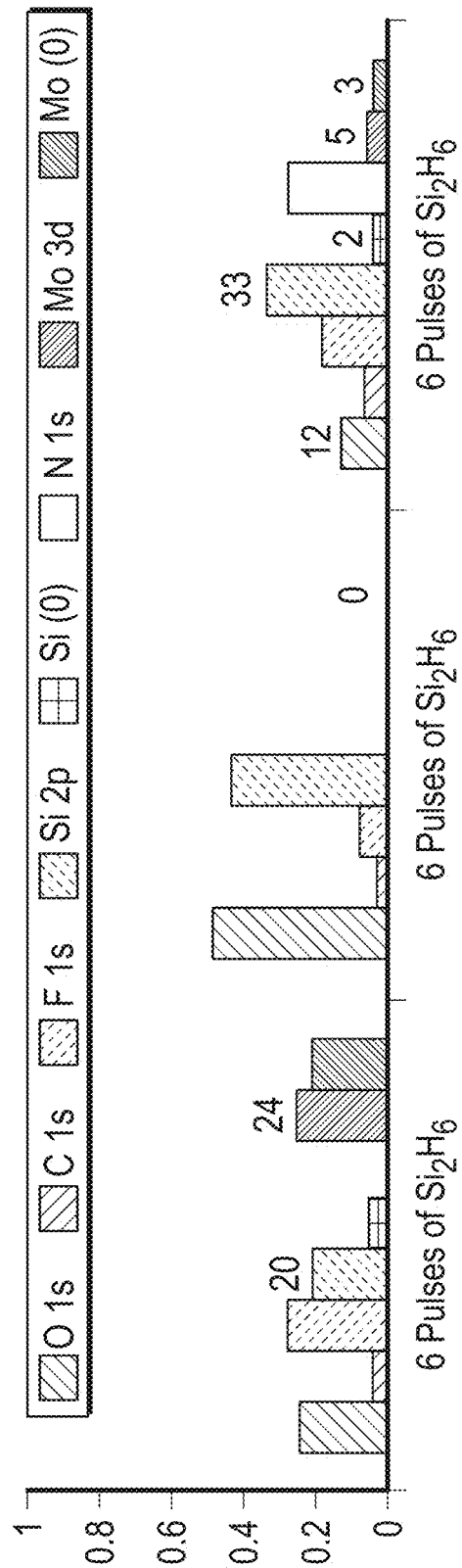
FIG. 3C illustrates XPS chemical composition data of various elements present on different substrate types after additional ALD cycles according to an embodiment described herein.

3A illustrates the chemical composition of a set of three substrates: HF cleaned Si, HF cleaned $SiO_2$, and HF cleaned patterned substrate. FIG. 3B illustrates the chemical composition of each of the FIG. 3A substrates after 5 ALD cycles of $MoF_6$ and $Si_2H_6$ at 120° C. The data indicated that a Si-deficient $MoSi_x$ was selectively deposited on Si and not on $SiO_2$. The $Si^0$ component of the patterned sample was also selectively attenuated by the $MoSi_x$ deposition. FIG. 3C illustrates the chemical composition of each of the FIG. 3B substrates after an additional 25.2 MegaL (between 3 pulses and 10 pulses) of $Si_2H_6$. The additional $Si_2H_6$ incorporated Si onto the $MoSi_x$ surface. Selectivity with respect to $SiO_2$ was maintained during the additional $Si_2H_6$ pulses ($SiO_2$ had 0% Mo and 0% $Si^0$ throughout the ALD process).

The three substrates were loaded together on a single substrate holder to ensure that they were exposed to identical deposition conditions. The Si and $SiO_2$ substrates allowed verification of selectivity during deposition on the patterned substrate. The patterned substrate has $SiO_2$ layers sandwiched by $SiN_x$ on top of the Si substrate. It is noted that the $SiN_x$ on the patterned substrate was actually SiON since it was ion damaged and ashed in $O_2$ during fabrication. As shown in FIG. 3A, a 30 s HF clean removed the native oxide on Si. The thermally grown $SiO_2$ was 300 nm thick and the 30 s of HF clean did not change the elemental composition or oxidation states of $SiO_2$. The HF cleaned patterned substrate was composed of a mixture of $SiN_x$, $SiO_x$ and $Si^0$.

XPS was performed after 5 ALD cycles of $MoF_6$ and $Si_2H_6$ at 120° C. as shown in FIG. 3B. XPS showed a surface composition of 32% Mo and 10% Si on the Si substrate which corresponds to highly Si-deficient $MoSi_x$. There was no $MoSi_x$ deposition on the $SiO_2$ substrate consistent with highly selective ALD. On the patterned substrate, XPS showed that 5% Mo was deposited, and the $Si^0$ was attenuated to 1%. The fraction of N and O at the surface did not change significantly during ALD on the patterned substrate. The data is consistent with Si-deficient $MoSi_x$ being deposited selectivity on the 6% of $Si^0$ on the patterned substrate.

Deposition selectivity on the pattern substrates is consistent with three aspects of embodiments described herein: (1) $MoSi_x$ deposition occurred on the Si substrate but not on the $SiO_2$ substrate. (2) After the $MoSi_x$ deposition, the $Si^0$ (not the higher oxidation state Si peaks from Si—N and Si—O) was attenuated on the pattered substrate. (3) Numerically, about 4% Mo deposition on the patterned substrate with 6% $Si^0$ is proportional to having 32% Mo on the Si substrate with 54% $Si^0$ on the HF clean surface.

Even though a monolayer of $MoSi_2$ was able to be deposited on Si in the ALD saturation experiments described in FIG. 1 and FIG. 2, consecutive ALD cycles did not produce stoichiometric $MoSi_2$. It is believed that the formation of Si deficient $MoSi_x$ is due to the surface Si—H species desorbing during the fluorosilane elimination process and to residual Mo—F bonds which are not readily removed by standard $Si_2H_6$ dosing. For the first 1-3 monolayers, there is an excess of Si from the substrate present to assist in fluorine desorption, but for thicker films, Mo—F surface bonds may persist since the only available Si is from the gaseous $Si_2H_6$. The overall fluorosilane elimination chemistry using $MoF_6$ and $Si_2H_6$ is consistent with one of two chemical reactions:

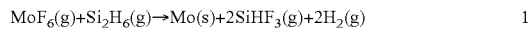

$$MoF_6(g) + Si_2H_6(g) \rightarrow Mo(s) + 2SiHF_3(g) + 2H_2(g) \quad 1$$

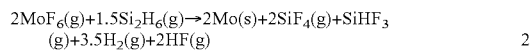

$$2MoF_6(g) + 1.5Si_2H_6(g) \rightarrow 2Mo(s) + 2SiF_4(g) + SiHF_3(g) + 3.5H_2(g) + 2HF(g) \quad 2$$

To form $MoSi_2$, the three substrates were exposed to an additional 25.2 MegaL (between 3 pulses and 10 pulses, such as 6 pulses) of $Si_2H_6$ at 120° C. (See FIG. 3C). After the additional $Si_2H_6$ exposure, Si increased to 20% on the Si substrate consistent with Si being incorporated into the film or on the surface of the substrate. The additional $Si_2H_6$ doses did not decrease the selectivity for deposition on Si versus $SiO_2$.

Figure 4A:
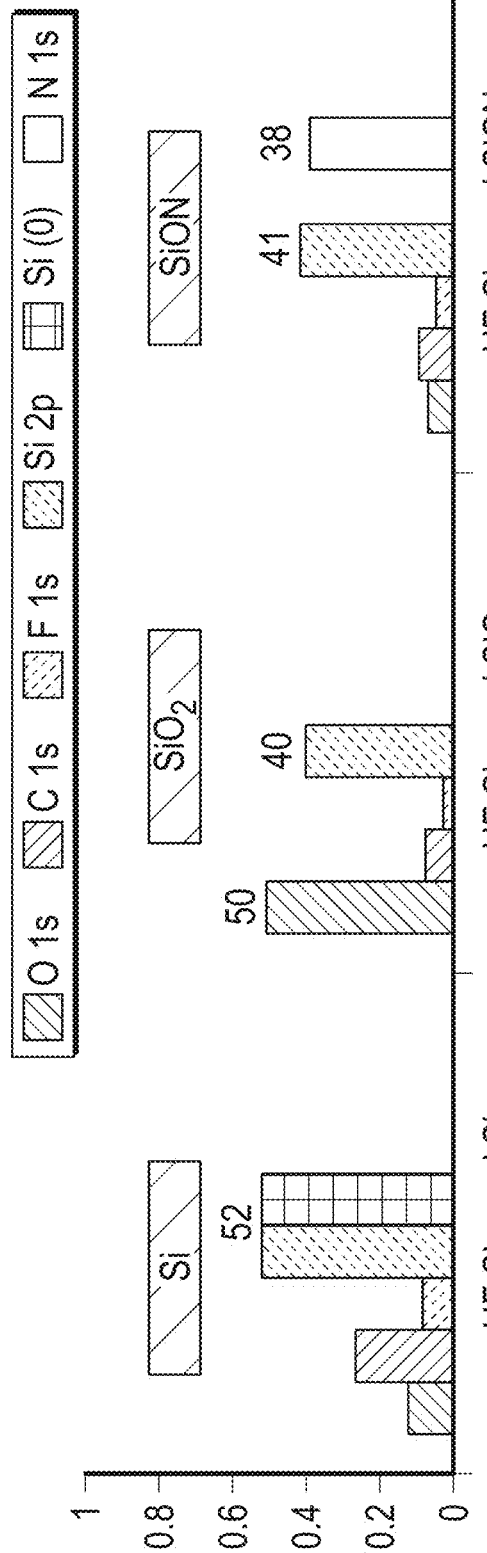
FIG. 4A illustrates XPS chemical composition data of various elements present on different substrate types prior to ALD processing according to an embodiment described herein.

FIGS. 4A-4C illustrate XPS chemical composition data of selective $MoSi_x$ deposition on HF cleaned Si, $SiO_2$, and SiON with a post deposition anneal. FIG. 4A illustrates XPS chemical composition of Si, $SiO_2$, and SiON substrates after the HF clean. FIG. 4B illustrates XPS chemical composition data showing the $MoSi_x$ was selectively deposited only on Si after the 5 ALD cycles of $MoSi_x$ followed by the additional 6 pulses (25.2 MegaL) of $Si_2H_6$ at 120° C. FIG. 4C illustrates XPS chemical composition data of the substrates with a post-deposition anneal (PDA) performed at 520° C. for 3 mins. As illustrated, the PDA removed F from the $MoSi_x$ film and reduced the Mo to $Mo^0$.

FIG. 4A illustrates that the SiON surface is composed primarily of $SiN_x$ after the HF clean. After the 5 cycles of $MoSi_x$ ALD followed by an additional 25.2 MegaL of $Si_2H_6$, there was 24% Mo and 18% Si on HF cleaned Si while less than 1% Mo was detected on the $SiO_x$ and $SiN_x$ surfaces as shown in FIG. 4B. Subsequently, the three substrates were annealed at 520° C. for 3 minutes which decreased F from 25% to 3% on the Si substrate. The 520° C. PDA also reduced the Mo to $Mo^0$ on the Si substrate and decreased the Si:Mo ratio from about 0.75 to about 0.5 at the surface. This is consistent with the desorption of surface F in the form of $SiHF_3$ or $SiF_4$. The XPS analysis of the PDA indicates that the F is removed from the film by the PDA which reduces the probability of F diffusion into adjacent MOSFET device structures.

Using an in-situ STM and ex-situ atomic force microscopy (AFM), the surface topographies were investigated after the deposition and the PDA on the Si and $SiO_2$ substrates. A separate substrate of HF cleaned Si after 20 cycles of $MoF_6$ and $Si_2H_6$ was prepared for the in-situ STM. The STM data indicated that the $MoSi_x$ film was atomically flat and conformal with an RMS roughness of about 2.8 Å. The aforementioned substrate was annealed in-situ at 500° C. for 3 mins in the ultra-high vacuum chamber at a pressure of about $5.0 \times 10^{-10}$ Torr. After the 500° C. anneal, the film became flatter with an RMS roughness of about 1.7 Å.

Another substrate of $MoSi_x$/HF cleaned Si after 5 ALD cycles at 120° C. followed by an in-situ 550° C. anneal was taken into an ex-situ furnace for a 900° C. spike anneal in 5% $H_2$ balanced with $N_2$. After the 900° C. spike anneal, AFM was used to obtain the surface morphology. The film retained a sub-nanoscale RMS roughness of 4.75 Å demonstrating that the $MoSi_x$ film has high thermal stability up to about 900° C.

Ex-situ AFM image data of the $SiO_2$ substrate surface after dosing 5 ALD cycles at 120° C. followed by an in-situ 550° C. anneal for 3 minutes in order to confirm the selectivity was performed by counting the number of nuclei on the substrate surface. The density of nuclei was about 9 nuclei/$\mu m^2$ which confirms the Si deposition preference over $SiO_2$. It is believed that the high deposition selectivity of the embodiments described herein is further improved by controlling wall temperature of the reaction chamber and by using short high pressure $Si_2H_6$ pulses and longer purge cycles to facilitate ALD and avoid a CVD deposition regime.

Figure 5A:
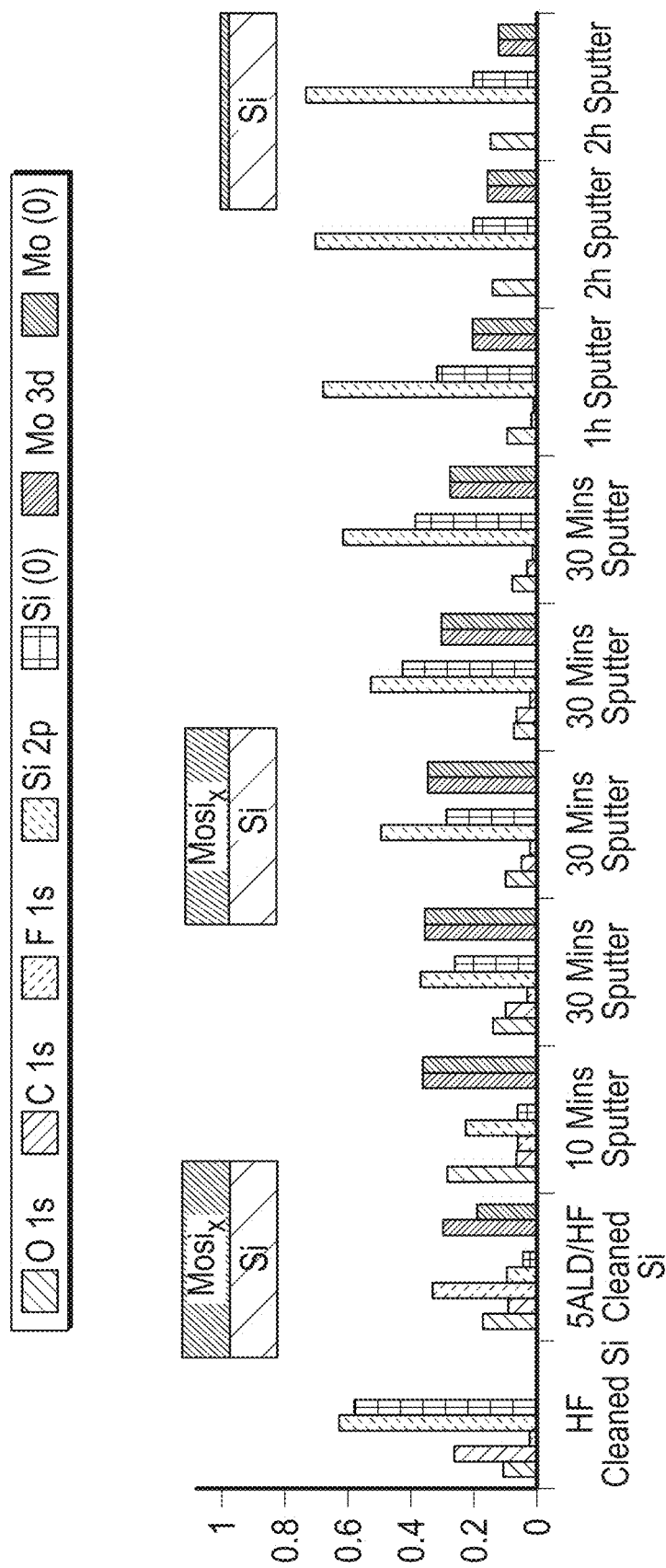
FIG. 5A illustrates XPS depth profiling data of a $MoSi_x$ film after Ar sputtering according to an embodiment described herein.

A depth profile study was also performed to determine the internal composition of the $MoSi_x$ film. FIG. 5A illustrates XPS chemical composition data after $Ar^+$ sputtering on HF cleaned Si after the 5 cycles of $MoF_6$ and $Si_2H_6$ at 120° C.

Figure 5B:
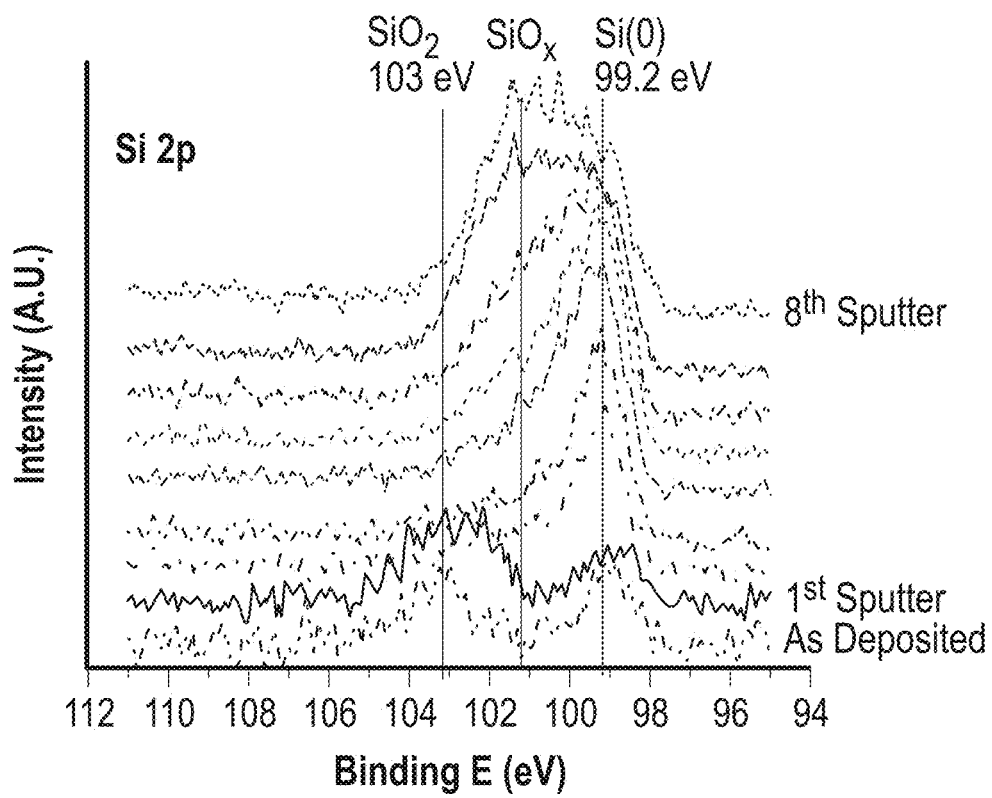
FIG. 5B illustrates XPS chemical composition data of the $MoSi_x$ film according to an embodiment described herein.
Figure 5C:
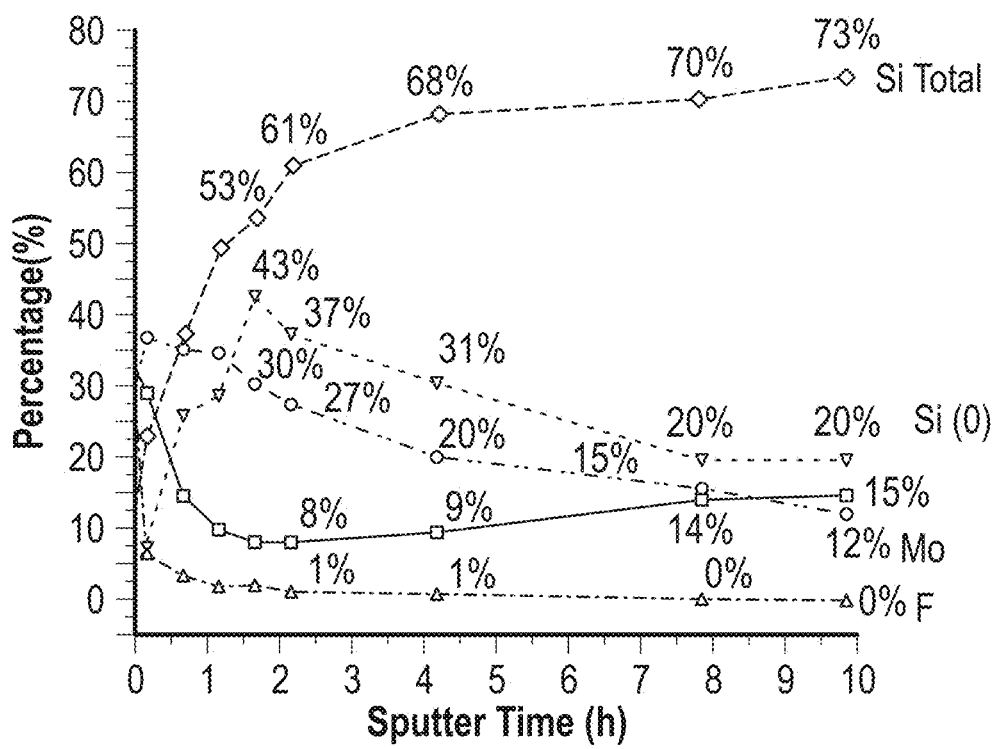
FIG. 5C illustrates data representative of the chemical composition of the $MoSi_x$ film versus time according to an embodiment described herein.

FIG. 5B illustrates XPS peaks of Si 2p after sequential Ar+ sputtering, the results of which show that the bulk of the $MoSi_x$ film consisted mostly of $Si^0$. FIG. 5C illustrates chemical composition data of the deposited film plotted versus Ar+ sputter time on Si after 5 cycles of $MoF_6$ and $Si_2H_6$ at 120° C.

The XPS data shown in FIG. 5A was derived from the $MoSi_x$ film deposited on a HF cleaned Si substrate at 120° C. using 5 ALD cycles of $MoF_6$ and $Si_2H_6$ without additional $Si_2H_6$ incorporation. As the sputtering time increased, the $MoSi_x$ film became thinner until the underlying Si substrate was exposed. The first 10 mins of sputtering decreased the F from 35% to 8% while the Mo shifted from a mixture of oxidized Mo and $Mo^0$ to pure $Mo^0$. The data is consistent with the surface F being bonded primarily to Mo.

Following consecutive sputtering cycles, the amount of Si increased and the amount of Mo decreased. Furthermore, the amount of $Si^0$ increased together with the total Si and reached a maximum at 43% after 100 mins of a total sputtering time. The $Si^0$ to $Mo^0$ ratio was employed to distinguish the pure $MoSi_x$ phase because, in the pure $MoSi_x$ phase, both Mo and Si are bonded to each other and have an oxidation state of 0. After removal of the silicon oxide and $MoF_x$ species at the substrate surface, the percentage of $Si^0$ exceeded that of $Mo^0$. The $Si^0$:$Mo^0$ ratio in the bulk of the $MoSi_x$ film was 1.41 which corresponds to a Si-deficient $MoSi_x$ film. It is noted that in the center of the film the Si:Mo ratio is 1.77 therefore, in the absence of background $O_2/H_2O$, it is possible the $Si^0$:$Mo^0$ ratio would be closer to 2.

FIG. 5B illustrates the raw XPS spectra of Si 2p corresponding to each XPS measurement of FIG. 5A. The Si peak at 99.2 eV increased and broadened to higher binding energy after the $4^{th}$ sputtering cycle. In contrast, the energy of the Mo peak corresponded to $Mo^0$ after each sputtering cycle. Thus it is believed that the bulk $MoSi_x$ film is predominantly $Si^0$ and $Mo^0$ in the form of $MoSi_x$ while the top surface and the bottom interface was rich in $SiO_x$. The top $SiO_x$ is consistent with contamination from the chamber environment while the bottom interfacial oxide is consistent with the imperfect ex-situ HF clean.

The sub-stoichiometric oxide at the bottom interface did not affect the deposition and film quality indicating that the selectivity of the $MoSi_x$ ALD is sensitive to the quality of the $SiO_2$. FIG. 5C illustrates the percentages of the chemical components obtained from the XPS measurement in FIG. 5A. After the second sputtering cycle (40 mins of total sputtering time), F decreased to below 3% and eventually reached 0%. O in the bulk of the film was <10% but slowly increased to 15% at the $MoSi_x$—Si interface which is consistent with the existence of an interfacial oxide layer.

To understand the effect of the additional $Si_2H_6$ doses on the Si:Mo ratio of $MoSi_x$ film, XPS depth profiling was performed on a $MoSi_x$ film which had the additional Si incorporation. An additional 6 pulses (25.2 MegaL) of $Si_2H_6$ were dosed at the end of the 5 ALD cycles of $MoF_6$ and $Si_2H_6$ at 120° C. followed by an anneal at 530° C. for 3 mins on dry cleaned Si. The post anneal dry clean process described herein utilized a plasma of $NF_3$ and $NH_3$ with Ar as a carrier gas.

Figure 6B:
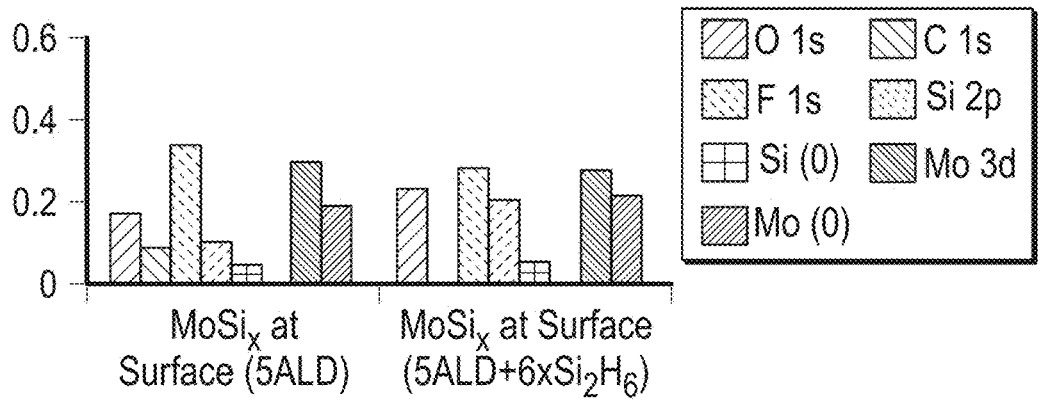
FIG. 6B illustrates surface composition data of a $MoSi_x$ film according to an embodiment described herein.
Figure 6C:
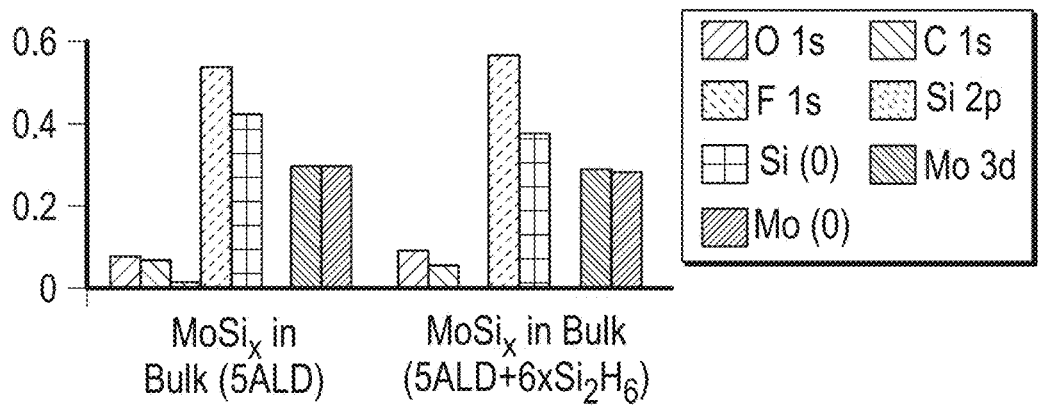
FIG. 6C illustrates bulk composition data of the $MoSi_x$ film of FIG. 6B according to an embodiment described herein.
Figure 6D:
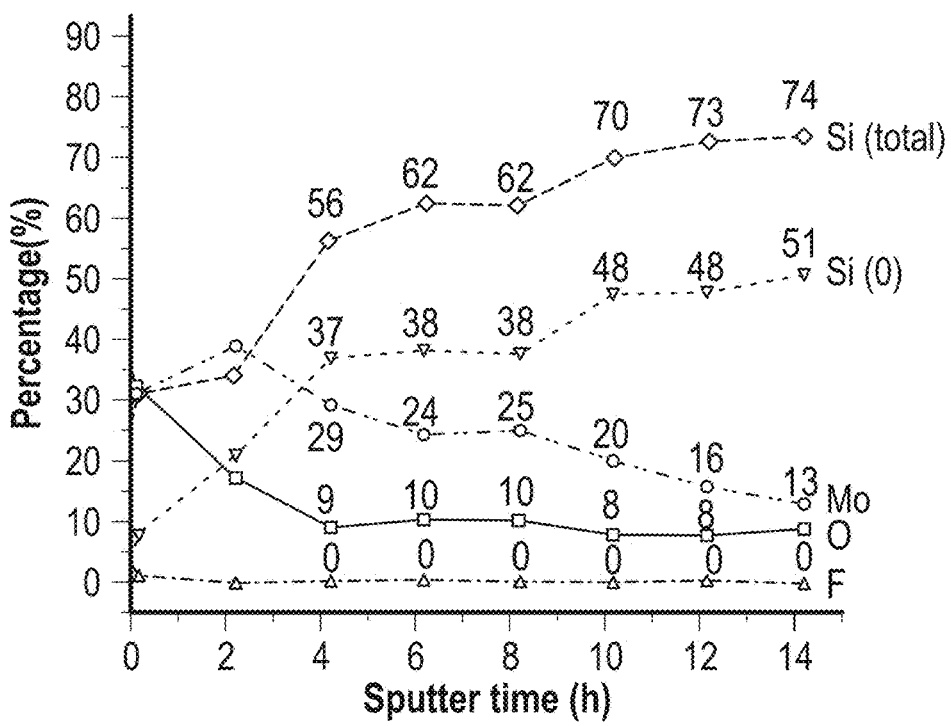
FIG. 6D illustrates data representative of the chemical composition of the $MoSi_x$ film versus time according to an embodiment described herein.

FIGS. 6A-6D illustrate XPS profile data of the $MoSi_x$ film with after exposure to the additional $Si_2H_6$ doses. FIG. 6A illustrates XPS chemical composition data after Ar+ sputtering dry cleaned Si after 5 cycles of $MoF_6$ and $Si_2H_6$ followed by additional 6 pulses (25.2 MegaL) of $Si_2H_6$ at 120° C. FIG. 6B illustrates XPS surface composition data after 5 ALD cycles of $MoF_6$ and $Si_2H_6$ with and without extra $Si_2H_6$ pulses. Si:Mo ratios were 0.33 for 5 ALD and 0.89 for 5ALD+6×$Si_2H_6$ which is consistent with Si incorporation on the surface. FIG. 6C illustrates XPS bulk composition data of $MoSi_x$ with and without extra $Si_2H_6$ pulses after removing surface contaminations using the Ar+ sputtering. Si:Mo ratios were 1.77 for 5 ALD and 1.96 for 5ALD+6×$Si_2H_6$. FIG. 6D illustrates XPS chemical composition data of the $MoSi_x$ film is plotted versus Ar+ sputter time on Si after 5 cycles of $MoF_6$ and $Si_2H_6$ followed by additional $Si_2H_6$ pulses at 120° C.

FIG. 6A presents a series of depth-profile XPS after each operation performed on the dry cleaned substrate. After the 6×$Si_2H_6$/5ALD cycles, there was 28% F, 20% Si, and 28% Mo at the substrate surface. F on the surface was mostly removed after the 530° C. anneal and the Mo was all reduced to $Mo^0$ which was consistent with the desorption of F from the surface as presented in FIG. 4C. The Si:Mo ratio was 0.89 at this operation. By comparison, the Si:Mo ratio of the $MoSi_x$ film without the extra $Si_2H_6$ doses was only 0.33 as illustrated in FIG. 6B.

After removing the surface oxide contamination, the $Si^0$:$Mo^0$ in the bulk was 1.32 (Si:Mo=1.96) for $MoSi_x$ with extra $Si_2H_6$ pulses. This was comparable to the $Si^0$:$Mo^0$=1.41 (Si:Mo=1.77) in the bulk of $MoSi_x$ without extra $Si_2H_6$ incorporation as depicted in FIG. 6C. Thus, it is believed that the extra $Si_2H_6$ pulses increase the Si content at the Si-deficient $MoSi_x$ surface after the ALD cycles. In contrast, the Si:Mo ratios in the bulk of the $MoSi_x$ films were close to stoichiometric $MoSi_2$. FIG. 6D shows the XPS percentage of each chemical component in the function of the Ar+ sputter time which is consistent with the $MoSi_x$ formation in bulk of the $MoSi_x$ film.

In one embodiment, 4.2 MegaL of $Si_2H_6$ was introduced to the reaction chamber over a duration of 6 seconds using a pneumatic valve. The $Si_2H_6$ process characteristics utilize an approximately 3 times larger $Si_2H_6$ exposure over a dosing duration about 10 times shorter than conventional $Si_2H_6$ dosing parameters. Thus, embodiments described herein utilize a 30× higher partial pressure during the ALD dose when compared to conventional dosing regimes. The 30× higher instantaneous pressure during dosing is believed to enable a precursor mediated $Si_2H_6$ chemisorption layer to remain on the surface long enough to react with the Mo to incorporate more Si into the $MoSi_x$ film. The Si incorporation is also believed to be self-limiting which enables a growth rate of $MoSi_x$ of about 1.2 nm/cycle.

The resistance of the $MoSi_x$ film was measured using a 4-point probe measurement. For the electrical measurement, updoped Si (001) with >10000 ohm·cm resistance was used as a substrate. For the electrical measurement, 10 cycles of $MoSi_x$ ALD at 120° C. was deposited on an HF cleaned intrinsic (semi-insulating) Si substrate followed by an in-situ 550° C. anneal for 3 minutes and a 900° C. spike anneal in 5% $H_2$ balanced in $N_2$. Ni dots were deposited as a probe contact. The resistance was 110 Ohm and, using an infinite sheet approximation, the resistivity was calculated as:

$$\rho = ktR_{max} = (4,53) \times (10 \times 10^{-7}) \times (110) = 493 \mu\Omega cm$$

where k is a constant, t is thickness and $R_{max}$ is the measured maximum resistance.

Figure 7:
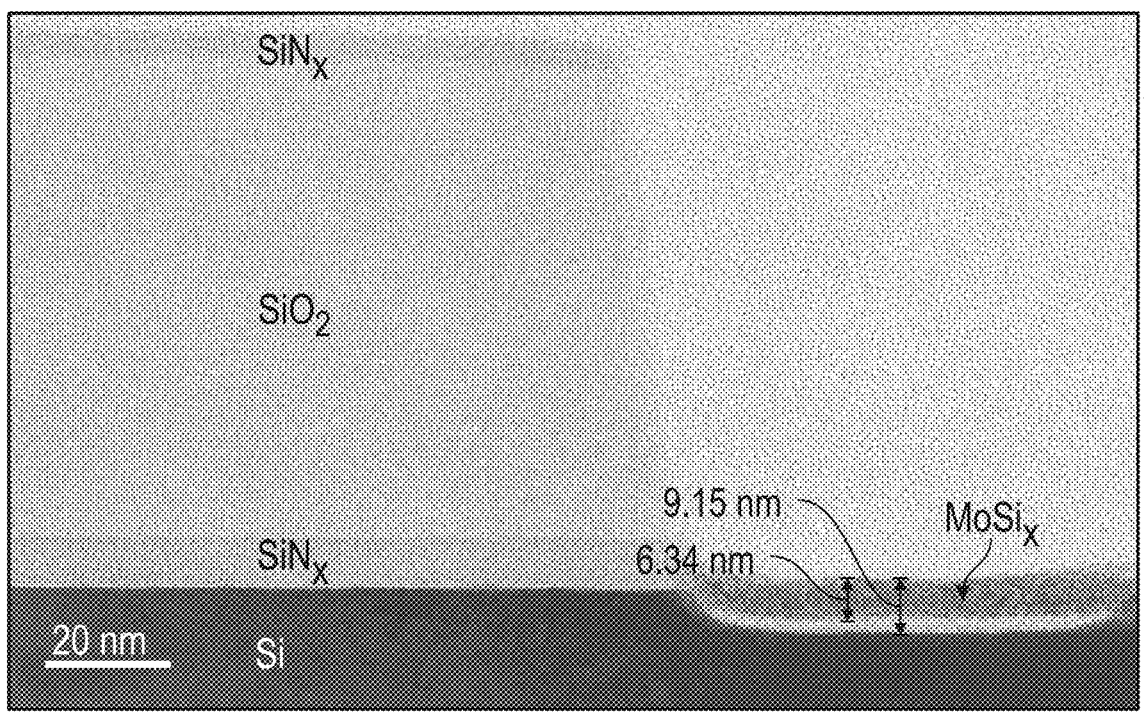
FIG. 7 is a cross-sectional tunneling electron micrograph (TEM) of a $MoSi_x$ film selectively deposited on silicon preferentially to other material present on the substrate according to an embodiment described herein.

A cross-sectional TEM study was performed on the patterned substrate to confirm the selectivity of $MoSi_x$ on the nanostructured pattern. FIG. 7 is a cross-sectional TEM image of the $MoSi_x$/HF cleaned patterned substrate. On the HF cleaned patterned substrate, 5 cycles of $MoSi_x$ ALD followed by an additional 25.2 MegaL of $Si_2H_6$ were dosed at 120° C. The elemental composition of this substrate at each deposition step is shown in FIGS. 3A-3C. The TEM image shows complete selectivity of MoSi$_x$ deposition on Si but not on SiN$_x$ nor SiO$_2$. The thickness of the MoSi$_x$ film deposited on Si was about 6.3 nm after the 5 ALD cycles followed by an additional 25.2 MegaL which achieved a growth rate of about 1.2 nm/cycle. Due to the growth rate per cycle of MoSi$_x$ ALD, 5 ALD cycles is believed to be sufficient for contact materials and contact device structures.

Selective atomic layer deposition of sub-stoichiometric MoSi$_2$ was achieved by a selective process on hydrogen-terminated Si versus thermally grown SiO$_2$, ion damaged SiON, and SiN$_x$. The selectivity is based on the favorable reactivity of MoF$_6$ and Si$_2$H$_6$ on H—Si but not on SiO$_2$ or SiN$_x$ since Si—O, Si—N, and SiO—H bonds are strong enough that they cannot be cleaved by either precursor at 120° C. Both MoF$_6$ and Si$_2$H$_6$ showed self-limiting behavior which allowed deposition of a highly conformal and smooth film with a root mean square (RMS) roughness of 2.8 Å. PDA in ultra-high vacuum at a temperature of between about 500° C. and 550° C. for 3 minutes further decreased the RMS roughness to 1.7 Å. The quality of the MoSi$_x$ film was preserved even after a 900° C. spike anneal in an H$_2$/N$_2$ environment which is consistent with high thermal stability.

A depth profiling XPS study revealed that the bulk of the MoSi$_x$ film is close to stoichiometric MoSi$_2$ (Si:Mo=1.7-1.9) with <10% oxygen and fluorine. The surface of the MoSi$_x$ film after 5 ALD cycles showed a highly Si-deficient MoSi$_x$ surface with Si:Mo ratio of 0.33 and this Si:Mo ratio at the surface is improved to 0.89 by pulsing extra Si$_2$H$_6$. The cross-sectional TEM imaging shows that the selectivity is retained on the nanoscale and that MoSi$_x$ can be selectively deposited on Si without substrate consumption.

The MoSi$_x$ film growth rate of about 1.2 nm/cycle enables less than 10 ALD cycles, such as 5 ALD cycles, to be sufficient for utilization of the MoSi$_x$ film as a contact material. Accordingly, process throughput is increased by utilizing the embodiments described herein when compared to conventional ALD processes. It is believed the selective MoSi$_x$ deposition eliminates or substantially reduces reliance on lithography processes for complicated 3D MOSFET structures (e.g FinFETs). The selectivity for Si—H bonds vs SiO—H bonds exceeds 10$^6$. Thus, high selectivity is possible on the nanoscale even without the use additional passivation layers. The embodiments described herein also illustrate that ALD of silicide versus metal could readily be switched while retaining selectivity by changing the partial pressure during the ALD pulse of the reductant.

While the foregoing is directed to embodiments of the present disclosure, other and further embodiments of the disclosure may be devised without departing from the basic scope thereof, and the scope thereof is determined by the claims that follow.

What is claimed is:

1. A substrate processing method, comprising:
   exposing a silicon containing substrate comprising bulk silicon oxide and native silicon oxide to a plasma formed from an NF$_3$ precursor and an NH$_3$ precursor to selectively remove the native silicon oxide from the substrate, the exposing comprising:
      heating the substrate to a temperature of between 40° C. and 50° C.; and
      exposing the substrate to the plasma for a period of time less than 40 seconds;
   heating the substrate to a first temperature;
   exposing the substrate to a plasma comprising hydrogen;
   exposing the substrate to a first dosage of a MoF$_6$ precursor;
   exposing the substrate to a second dosage of a Si$_2$H$_6$ precursor;
   sequentially cycling the exposing the substrate to the first dosage and the exposing the substrate to the second dosage; and
   after the sequential cycling, exposing the substrate to a third dosage of the Si$_2$H$_6$ precursor.

2. The method of claim 1, further comprising:
   annealing the substrate after the exposing the substrate to the third dosage at a second temperature of between 500° C. and 550° C.

3. The method of claim 1, wherein the first temperature is between 100° C. and 150° C.

4. The method of claim 1, wherein the sequential cycling is performed less than 10 times.

5. The method of claim 4, wherein the sequential cycling is performed 5 times.

6. The method of claim 1, wherein the plasma comprising hydrogen is formed from precursors selected form the group consisting of NF$_3$, NH$_3$, and H.

7. The method of claim 1, wherein a nitrogen purge process utilizing N$_2$ is performed during the sequential cycling.

8. The method of claim 1, wherein the first dosage is performed for a duration of between 10 ms and 100 ms.

9. The method of claim 8, wherein the first dosage comprises a MoF$_6$ flow rate of between 1 MegaL and 10 MegaL.

10. The method of claim 8, wherein the second dosage is performed for a duration of between 1 ms and 50 ms.

11. The method of claim 10, wherein the second dosage comprises a Si$_2$H$_6$ flow rate of between 1 MegaL and 10 MegaL.

12. The method of claim 11, wherein the third dosage comprises a Si$_2$H$_6$ flow rate of between 20 MegaL and 50 MegaL.

13. The method of claim 12, wherein the third dosage comprises between 3 pulses and 10 pulses of Si$_2$H$_6$.

14. The method of claim 1, further comprising:
   selectively depositing a MoSi$_x$ film on the silicon containing surface at a growth rate of 1.2 nm per sequential cycle.

15. A substrate processing method, comprising:
   positioning a silicon containing substrate comprising bulk silicon oxide and native silicon oxide on a heater in a reaction chamber having chamber walls;
   exposing the substrate to a plasma formed from an NF$_3$ precursor and an NH$_3$ precursor to selectively remove the native silicon oxide from the substrate, the exposing comprising:
      heating the substrate to a temperature of between 40° C. and 50° C.; and
      exposing the substrate to the plasma for a period of time less than about 40 seconds;
   heating the substrate on the heater to a first temperature;
   maintaining the chamber walls at a second temperature less than the first temperature;
   exposing a silicon containing surface of the substrate to hydrogen;
   exposing the substrate to a first dosage of a MoF$_6$ precursor;
   exposing the substrate to a second dosage of a Si$_2$H$_6$ precursor;
   sequentially cycling the exposing the substrate to the first dosage and the exposing the substrate to the second dosage; and after the sequential cycling, exposing the substrate to a third dosage of the $Si_2H_6$ precursor.

* * * * *

UNITED STATES PATENT AND TRADEMARK OFFICE
CERTIFICATE OF CORRECTION

PATENT NO. : 10,586,707 B2
APPLICATION NO. : 16/189429
DATED : March 10, 2020
INVENTOR(S) : Raymond Hung et al.

Page 1 of 1

It is certified that error appears in the above-identified patent and that said Letters Patent is hereby corrected as shown below:

In the Specification

In Column 12, Line 58, delete "$\rho=ktR_{max}=(4,53)\times(10\times10^{-7})\times(110)=493\mu\Omega cm$" and insert -- $\rho=ktR_{max}=(4.53)\times(10\times10^{-7})\times(110)=498\mu\Omega cm$ --, therefor.

In the Claims

In Column 14, Line 55, in Claim 15, after "than" delete "about".

Signed and Sealed this
Twenty-sixth Day of May, 2020

Andrei Iancu
*Director of the United States Patent and Trademark Office*